United States Patent
Shimoda et al.

[11] Patent Number: 5,670,998
[45] Date of Patent: Sep. 23, 1997

[54] INK JET HEAD HAVING PLURAL TERMINALS ELECTRICALLY CONNECTED IN COMMON DURING STORAGE

[75] Inventors: Junji Shimoda, Chigasaki; Sakiko Tanabe, Tokyo; Toshiaki Hirosawa, Hiratsuka, all of Japan

[73] Assignee: Canon Kabushiki Kaisha, Tokyo, Japan

[21] Appl. No.: 101,821

[22] Filed: Aug. 4, 1993

Related U.S. Application Data

[63] Continuation of Ser. No. 949,370, Sep. 23, 1992, abandoned, which is a continuation of Ser. No. 798,343, Nov. 20, 1991, abandoned, which is a continuation of Ser. No. 611,443, Nov. 13, 1990, abandoned, which is a continuation of Ser. No. 263,070, Oct. 27, 1988, abandoned.

[30] Foreign Application Priority Data

Oct. 30, 1987 [JP] Japan .................. 62-275033

[51] Int. Cl.⁶ .................. B41J 2/05; H05F 3/02
[52] U.S. Cl. .................. 347/50; 174/51; 361/220
[58] Field of Search .................. 347/50, 58, 57; 361/220, 212; 439/188; 174/51, 268, 78

[56] References Cited

U.S. PATENT DOCUMENTS

| | | | |
|---|---|---|---|
| 3,648,108 | 3/1972 | Bailey | 361/212 |
| 3,653,498 | 4/1972 | Kisor | 361/212 X |
| 3,774,075 | 11/1973 | Medesha | 361/212 |
| 3,908,153 | 9/1975 | Cason | 361/220 |
| 4,179,178 | 12/1979 | Bachman | 361/212 X |
| 4,223,368 | 9/1980 | Dattilo | 361/200 |
| 4,380,018 | 4/1983 | Andoh et al. | 346/140 R |
| 4,429,321 | 1/1984 | Matsumoto | 346/140 |
| 4,567,493 | 1/1986 | Ikeda et al. | 346/140 R |
| 4,602,261 | 7/1986 | Matsuda | 346/140 |
| 4,669,152 | 6/1987 | Alexander | 24/30.5 |
| 4,723,129 | 2/1988 | Endo | 346/140 X |
| 4,775,868 | 10/1988 | Sugiura | 347/50 X |

FOREIGN PATENT DOCUMENTS

| | | | |
|---|---|---|---|
| 2830937 | 1/1980 | Germany | 361/220 |
| 59-205740A | of 1983 | Japan . | |
| 59-107698A | of 1983 | Japan . | |

OTHER PUBLICATIONS

Western Electric Technical Digest, Jan. 1977, "Shorting Clip Assembly and Removal Tool", E.P. Gurski.
EDN, Sep. 1980, "Zap the Zapper before it zaps your designs", J. McDermott.

*Primary Examiner*—Joseph W. Hartary
*Attorney, Agent, or Firm*—Fitzpatrick, Cella, Harper & Scinto

[57] ABSTRACT

A method for preserving an ink jet head and an ink jet head unit which can prevent worsening of the ink discharging features when the ink jet head is preserved or stored before it is assembled to an ink jet recording apparatus. The preserving method and the ink jet head unit are characterized in that terminals connected respectively to a plurality of energy generating means for generating energy for discharging ink are all also connected to each other by conductive means such as a clip or conductive tape.

7 Claims, 4 Drawing Sheets

5,670,998

INK JET HEAD HAVING PLURAL TERMINALS ELECTRICALLY CONNECTED IN COMMON DURING STORAGE

This application is a continuation of U.S. application Ser. No. 07/949,370 filed Sep. 23, 1992, now abandoned, which is a continuation of U.S. application Ser. No. 07/798,343 filed Nov. 20, 1991, abandoned, which is a continuation of U.S. application Ser. No. 07/611,443 filed Nov. 13, 1990, abandoned, which is a continuation of U.S. application Ser. No. 07/263,070 filed Oct. 27, 1988, abandoned.

BACKGROUND OF THE INVENTION

1. Field of the Invention

The present invention relates to a method for preserving an ink jet head and an ink jet head unit provided with such ink jet head, and more particularly, it relates to a method for preserving an ink jet head which is to be preserved before assembly to an ink jet printer or which is to be distributed as a service part, and an ink jet head unit provided with such ink jet head.

2. Related Background Art

A recording apparatus such as a printer, a facsimile and the like is constructed to form a predetermined dot pattern on a sheet (recording mediums such as paper, a plastic web and the like) supported by, for example, a platen, by energizing an energy generating means provided on a recording head according to recording information. Such recording apparatuses are grouped, according to their recording patterns, into an ink jet system, wire dot system, thermal printing system or the like.

As recording heads in ink jet recording systems, there are heads using piezo-electric elements (electrical-mechanical converters) provided for the respective ink discharging openings as energy generating means for generating energy utilized to expel ink droplets from the ink discharging openings and heads using exothermic elements (electrical-thermal converters) provided for the respective ink discharging openings, for example in a bubble jet system and the like.

The piezo-electric elements of such a recording head are normally attached around a chamber in an ink path by means of an adhesive. Consequently, when surrounding temperature is changed, the piezo-electric elements are subjected to stress, due to the difference in coefficient of thermal expansion between the piezo-electric elements and the adhesive or between the piezo-electric elements and the material forming the chamber.

On the other hand, conventionally, such a recording head, before assembly to the recording apparatus, has been preserved or stored in a condition that electrical connection terminals of the piezo-electric elements are electrically insulated.

Therefore, when the recording head was in the preserved condition before it was assembled to the recording apparatus, for example, when the recording head has been stored as a service part for a long time, the piezo-electric elements were subjected to stress due to changes in the surrounding temperature, with the result that electric charges were generated on the piezo-electric elements, thus frequently destroying polarization of the piezo-electric element. Consequently, in the conventional ink jet recording head, there was a problem that, when the recording head itself was stored for a long time before it was assembled to the recording apparatus, due to the reduction of polarization rate of the piezo-electric elements, the diameter of each ink droplet was reduced or the discharge speed of the ink droplet was decreased, thus losing the recording integrity.

Further, in the ink jet head particularly having the exothermic elements (electrical-thermal converters), there was a problem that, when the ink jet head was preserved, if foreign matter contacted the electrical connection terminals of the exothermic elements, static electricity was generated in the head, which caused the concentration of electric potential into a heater adversely to affect the latter, thus worsening the discharging feature of the ink jet head or destroying the ink jet head itself.

SUMMARY OF THE INVENTION

Figure 1:
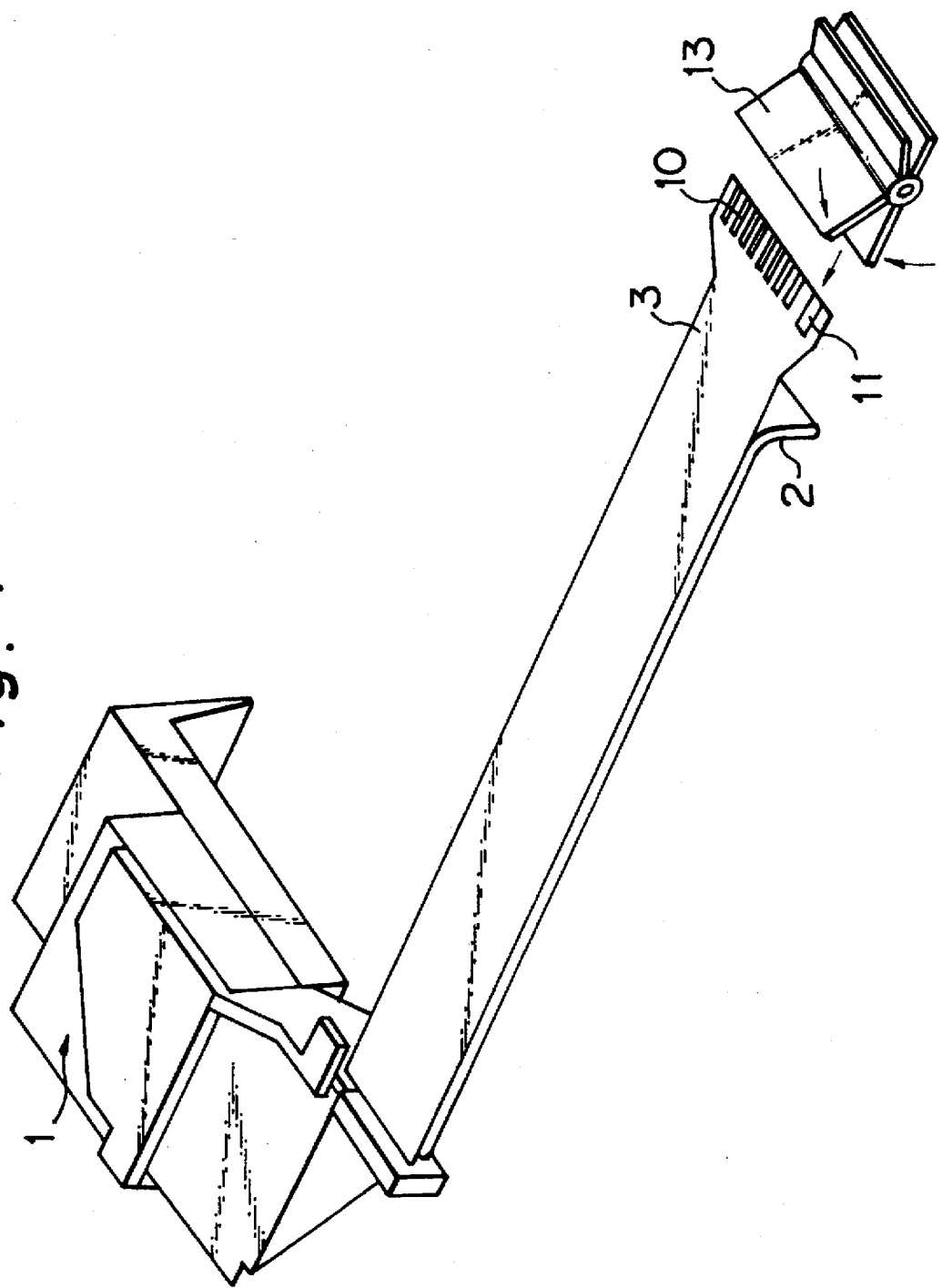
FIG. 1 is a schematic perspective view of an ink jet head unit according to an embodiment of the present invention.

An object of the present invention is to provide a method for preserving an ink jet head and an ink jet head unit, which can solve the above-mentioned problems of the conventional heads and which can prevent the worsening of the ink discharging feature, for example, even when the head is stored for a long time before it is assembled to the recording apparatus.

Another object of the present invention is to provide an ink jet head unit comprising an ink jet head having a plurality of energy generating means for generating energy utilized to discharge ink, and electrical connecting means for electrically connecting terminals connected, respectively, to the plurality of the energy generating means in common.

A further object of the present invention is to provide a method for preserving an ink jet head wherein terminals connected respectively to a plurality of energy generating means for generating energy utilized to discharge ink are electrically connected to each other in common.

Yet another object of this invention is to provide a method for preserving an ink jet head by providing an ink jet head having plural energy generating means for generating energy to discharge ink, the ink jet head being mountable on a recording apparatus for supplying recording signals to the energy generating means by plural electrical wires extending in a flexible cable, the flexible cable having an end and another end, and the electrical wires extending from the one end thereof. The flexible cable has plural electrical contact portions including discrete electrode terminals and a common electrode terminal disposed at the other end of the flexible cable, and the recording apparatus is to be connected to the electrical contact portions. The method also involves electrically connecting in common the plural electrical contact portions using a resilient conductive means including a pair of plate-shaped members to be clipped onto the flexible cable at the plural electrical contact portions.

A further object of this invention is to provide an ink jet head unit which includes an ink jet head having plural energy generating means for generating energy used to discharge ink, a flexible cable, having an end and another end, the flexible cable being coupled to the ink jet head at the one end thereof and having plural electrical wires extending in the flexible cable and corresponding plural electrical contact portions formed at the other end of the flexible cable for supplying electrical signals to the said energy generating means, the plural electrical contact portions including discrete electrode terminals and a common electrode terminal, and resilient conductive means including a pair of plate-shaped members to be clipped on the other end of the flexible cable at the electrical contact portions for electrically connecting them in common during storage of the ink jet head, prior to mounting in a recording apparatus.

DETAILED DESCRIPTION OF PREFERRED EMBODIMENTS

The present invention will now be concretely explained with reference to the attached drawings.

FIG. 1 shows a schematic perspective view of an embodiment of an ink jet head unit according to the present invention.

In the embodiment shown in FIG. 1, ink supply tubes 2 and a signal supplying flexible cable 3 are connected to an ink jet recording head 1 including ink passages communicating with a plurality (for example, thirty-two) of ink discharging openings, piezo-electric elements attached around chambers in the ink passages by an adhesive, and a sub-tank 5 into which recording ink to be supplied to the ink passages is reserved.

Figure 2:
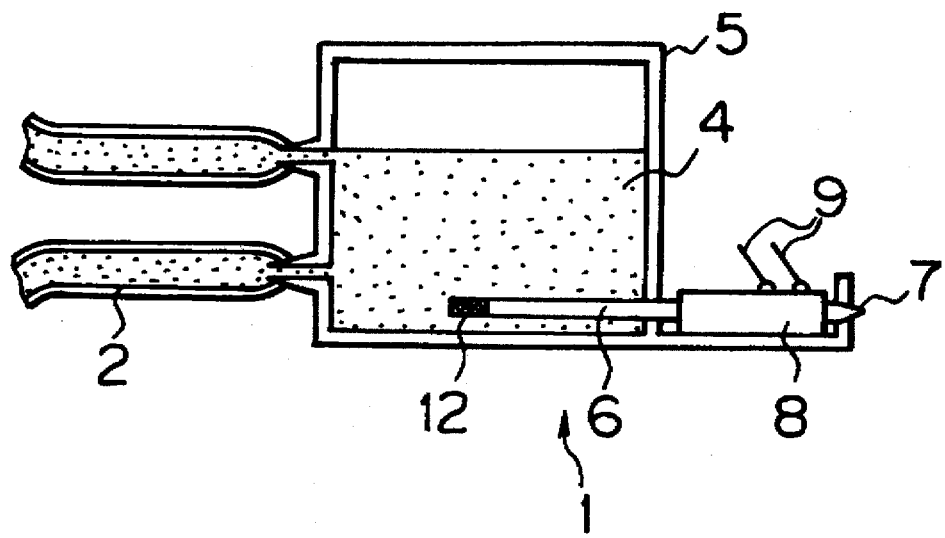
FIG. 2 is a schematic longitudinal sectional view of a part of the ink jet head of FIG. 1.

In FIG. 2 showing a schematic longitudinal sectional view of a part of the recording head of FIG. 1, the recording head 1 includes the sub-tank 5 within which the ink 4 is reserved, and a plurality of nozzles 6 sealingly communicated with the interior of the sub-tank and forming the respective ink passages. Each nozzle 6 has an ink discharging opening 7 at its tapered free end, and piezo-electric elements 8 are fixed around a chamber (a portion where energy utilized to discharge an ink droplet is supplied to the ink) of each nozzle 6.

The piezo-electric elements 8 act as energy generating means for generating energy utilized to create the ink droplets discharged from the ink discharging opening 7, and are attached, for example, by an epoxy adhesive, to the corresponding nozzle 6 to enclose the circumference of the nozzle.

The ink supply tubes 2 are extended from the head as shown in FIG. 1, the other ends of the tubes being connected to an main ink tank (normally, for example, a cartridge-type tank which is not shown). The ink is supplied from the main tank to the sub-tank.

Each of the piezo-electric elements 8 is provided with electrode terminals 9, connected to electrical connecting terminals, and printed wirings on the flexible cable 3 are electrically connected to the electrode terminals 9 of each piezo-electric element 8. On the other end of the flexible cable 3, an electrical connecting terminal having a plurality of discrete electrodes 10 connected to the ends of the wiring communicated with each of the plural piezo-electric elements 8 and a single common electrode 11 is formed. Incidentally, as shown in FIG. 2, a filter 12 is arranged at an ink inlet end of each nozzle 6.

FIG. 1 shows, for example, an ink jet recording head (formed as a unit by connecting the flexible cable and the like) which is in a preserved condition before it is assembled to the recording apparatus. In such a condition, a conductive clip 13 comprises electrical connecting means which has a small value of resistant sufficient to discharge the electric charges generated on the piezo-electric elements 8 and electrically short-circuit the electrode terminals 9 of the piezo-electric elements 8 attached to the recording head (In FIG. 1, the clip is not attached to the head).

The conductive clip 13 is a conductive part for discharging the electric charges generated on the piezo-electric elements 8 by the stress acting on the piezo-electric elements due to the change in the surrounding temperature. In the illustrated embodiment, the conductive clip is closedly attached to each of the electrical connecting terminals i.e., electrodes 10 and 11 formed on the end of the flexible cable 3.

The conductive clip 13 shown in FIG. 1 can be attached to the end of the flexible cable 3 to pinch it by the action of a spring (not shown) provided in the clip. The clip can be easily removed from the flexible cable by pressing grips against the action of the spring to open the clip.

According to the ink jet recording head as explained in connection with FIGS. 1 and 2, since the electrode terminals 9 of each piezo-electric element 8 can be electrically short-circuited or can be dischargeably connected by connecting the conductive clip 13 to the head, even when the ink jet recording head itself is stored for a long time, it was found that the worsening of the recording ability of the recording head could be prevented.

More particularly, in case of the ink jet recording head having the construction shown in FIG. 2, if the head is stored in lower temperature environment, the piezo-electric elements are subjected to external compressive force due to the difference in coefficient of thermal expansion between the piezo-electric elements 8 and the epoxy adhesive. By such external force, there arise electric charges having polarization opposite to the polarization of the piezo-electric element.

Consequently, if the electric charges generated on the piezo-electric elements 8 cannot be discharged as in the case of the conventional ink jet recording head, when the head is stored in the lower temperature environment, an electric field having the polarization opposite to the polarization of the piezo-electric elements acts on the piezo-electric elements 8, thus frequently decreasing the polarization rate of the piezo-electric elements to worsen the piezo-electric feature.

However, according to the present invention, since the electrode terminals 9 of each piezo-electric element 8 (through electrodes 10 and 11 of the flexible cable) are electrically short-circuited or the terminals of the piezo-electric element are connected through the small value of resistance sufficient to discharge the electric charges generated on the piezo-electric element by the presence of the conductive clip 13, even when the head is stored for a long time in the environment where the temperature is changed, it was found that the feature of the piezo-electric elements was not worsened for a long time.

The following Table 1 shows experimental data indicating the technical effects of the ink jet head according to the present invention, compared with the conventional ink jet recording head.

TABLE 1

| Each Feature | Non-Use of Conductive Clip | | Use of Conductive Clip | |
| --- | --- | --- | --- | --- |
| | Initial Feature | Feature after stored −30° C., 360 hours | Initial Feature | Feature after stored −30° C., 360 hours |
| Electrostatic Capacity of Piezo-Electric Element (nF) | 4.8 | 4.1 | 4.9 | 4.6 |
| Discharge Speed of Ink Droplet (m/s) | 8.4 | 6.2 | 8.6 | 8.1 |
| Diameter of Ink Droplet (μm) | 72 | 65 | 69 | 68 |

The Table 1 shows the comparison in electrostatic capacity of the piezo-electric element, discharging speed of the recording liquid droplet (ink droplet) and diameter of the recording liquid droplet after the ink jet recording heads are stored for 360 hours in a temperature of −30° C. between the head not using the conductive clip (conventional head) and the head using the conductive clip (present invention).

Each of the values indicated in the Table 1 is an average value of values obtained from ten samples. As apparent from the Table 1, when the head is stored in the lower temperature environment, the change in each of features regarding the ink discharging if the conductive clip 13 is used (present invention) is apparently smaller than that in the case of non-use of the conductive clip (conventional head), which proves that the use of the conductive clip 13 improves the features regarding the ink charging ability of the ink jet recording head.

Figure 3:
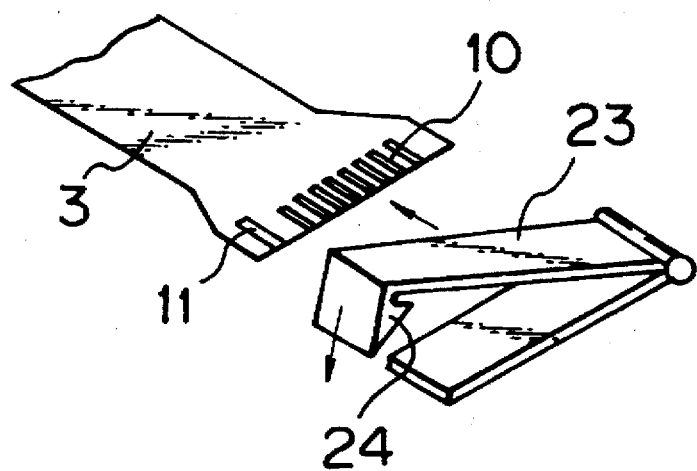
FIG. 3 is a partial schematic perspective view of another electrical connecting means according to the present invention.

Next, FIG. 3 shows another/conductive clip 23 which can be used in place of the conductive clip 13 of FIG. 1 and which has a different construction from the clip 13. The conductive clip 23 is also made of conductive material and can be sealingly attached to each of the electrical connecting terminals 10 and 11 formed on the end of the flexible cable 3. In this case, the conductive clip 23 is attached to the flexible cable in such a manner that it pinches the end of the flexible cable 3 from both upper and lower sides and then a hook 24 formed on one free end of the clip 23 is latched to the other free end of the clip, thereby pressing inner surfaces of the clip against the electrical connecting terminals 10, 11 of the end of the flexible cable 3 by the elastic force of the clip itself.

Alternatively, in a further embodiment of the present invention, in place of the clip 13 (FIG. 1) or clip 23 (FIG. 3), an conductive adhesive tape (not shown) may be adhered on the electrical connecting terminals 10, 11 formed on the end of the flexible cable 3, in which case substantially the same effect as in the case of the clips can be obtained.

As mentioned above, in the present invention, various conductive members having various configurations other than the clip can also be used as the electrical connecting means, i.e., conductive means.

Incidentally, as material for forming the electrical connecting means, metal or conductive organic material (conductive rubber, conductive resin and the like) can be used.

Figure 4:
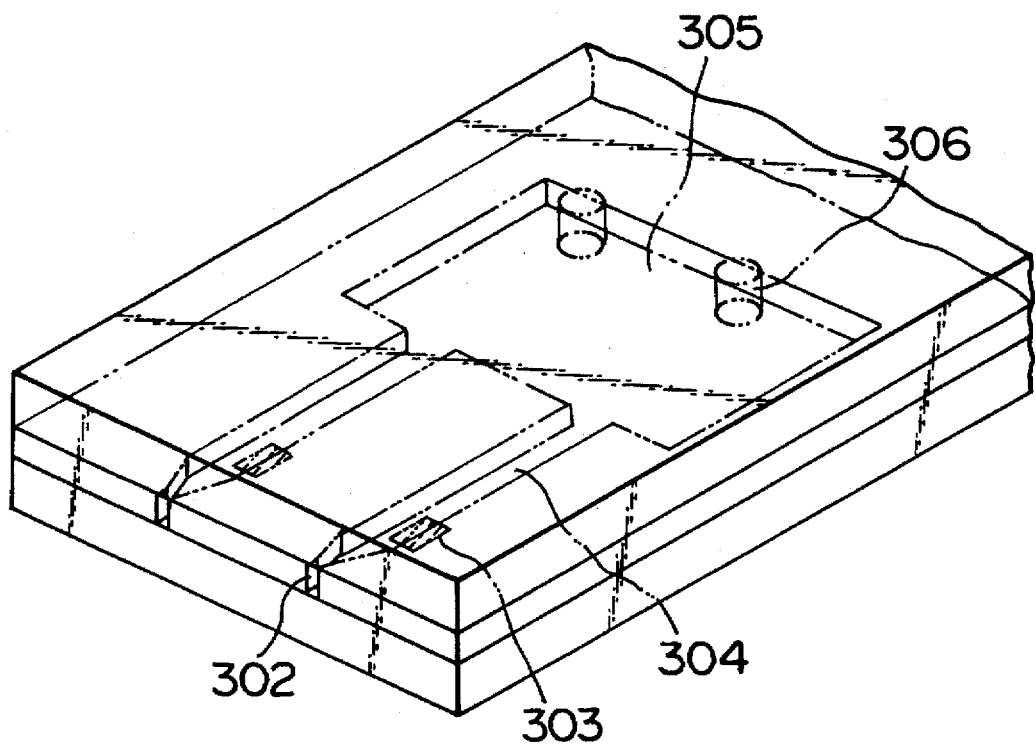
FIG. 4 is a schematic perspective view showing another embodiment of the ink jet head according to the present invention.

FIG. 4 is a schematic perspective view of an ink jet head according to another embodiment of the present invention. This ink jet head can be used in place of the ink jet head of FIG. 1. In FIG. 4, the reference numeral 302 designates a discharging opening, 304 designates a liquid passage communicated with the corresponding discharging opening, 305 designates a liquid chamber communicated with the liquid passages, and 306 designates a supply port communicating with the liquid chamber 305. In each liquid passage 304, a heater portion 303 of an exothermic element (electrical-thermal converter) used as energy generating means for generating energy utilized to discharge the liquid or ink is provided.

The electrical-thermal converter comprises an exothermic resist layer (not shown) and an electrode layer (not shown) electrically connected to the exothermic resist layer. The electrode layer is connected to the electrical connecting terminals 10 and 11 through the flexible cable 3 of FIG. 1. The ink is supplied to the head by means of the ink supply tubes 2 of FIG. 1 through the supply ports 306.

Figure 5:
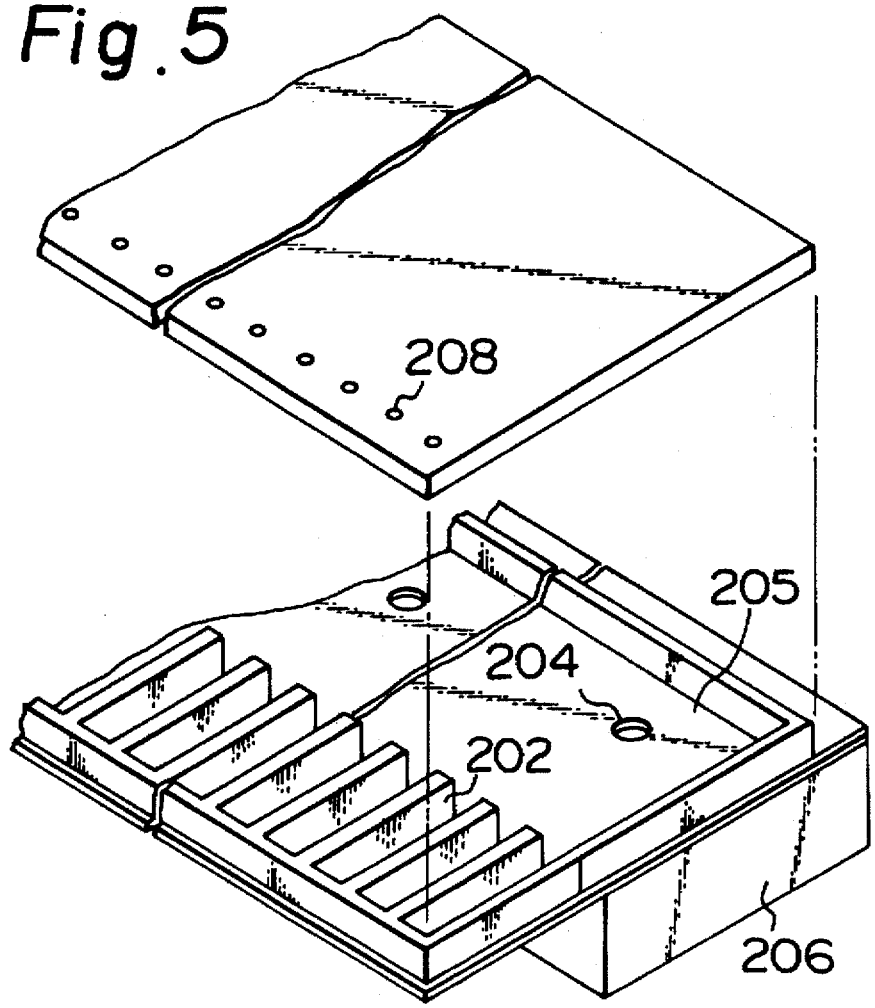
FIG. 5 is a exploded perspective view showing further embodiment of the ink jet head according to the present invention.

FIG. 5 is a schematic perspective view of an ink jet head according to a further embodiment of the present invention. This ink jet head can also be used in place of the ink jet head of FIG. 5. In FIG. 5, the reference numeral 208 designates a discharging opening, 202 designates a liquid passage communicating with the corresponding discharging opening 208, 205 designates a first liquid chamber communicating with the liquid passages 202, 204 designates a supply port communicating with the first liquid chamber 205, and 206 designates a second liquid chamber communicated with the supply ports 204. Below each of the discharging openings 208, in each of the liquid passages 202, a corresponding heater portion (not shown) of an exothermic element (electrical-thermal converter) used as energy generating means for generating energy utilized to discharge the liquid or ink.

The electrical-thermal converter comprises an exothermic resistance layer (not shown) and an electrode layer (not shown) electrically connected to the exothermic resist layer. The electrode layer is connected to the electrical connecting terminals 10 and 11 through the flexible cable 3 of FIG. 1.

The ink is supplied to the second liquid chamber 206 by means of the ink supply tubes 2 of FIG. 1 and then is supplied to the first liquid chamber 205 through the supply ports 204.

The ink jet head of FIG. 5 mainly differs from that of FIG. 4 in the relation between a direction to which the ink is supplied to the heater portion and a direction to which the ink is discharged from the discharging openings. That is to say, in the ink jet head of FIG. 4, the above-mentioned directions are the substantially the same; whereas, in the ink jet head of FIG. 5, the above-mentioned directions are different from each other and are substantially orthogonal to each other.

With respect to the ink jet heads having the energy generating means as shown in FIGS. 4 and 5, when the head is preserved by utilizing the conductive means 13 shown in FIG. 1, it is possible to easily solve the problems arise due to static electricity and the like.

Figure 6:
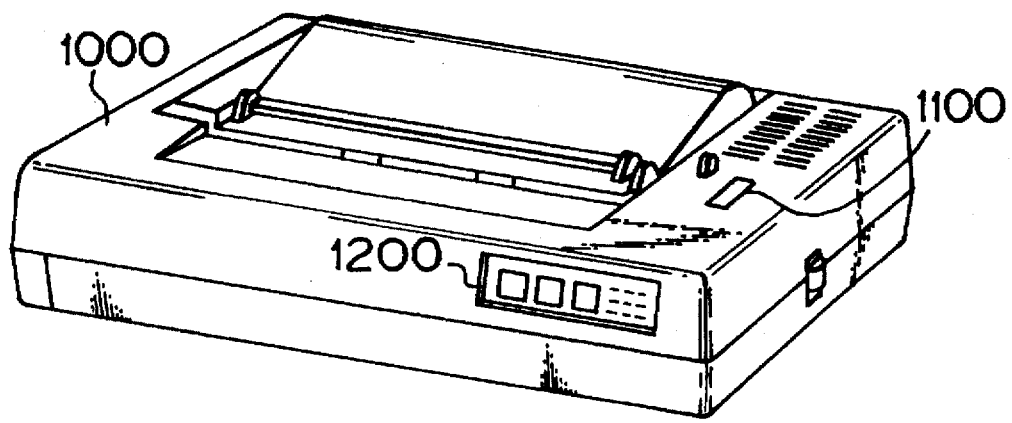
FIG. 6 is a schematic perspective view of an ink jet apparatus incorporating the ink jet head disengaged from the electrical connecting means.

FIG. 6 is a schematic perspective view of an ink jet apparatus into which the ink jet head obtained by removing the electrical connecting means or conductive means from the above-mentioned ink jet unit is incorporated. In FIG. 6, the reference numeral 1000 designates a body of the ink jet recording apparatus, 1100 designates a switch for a power source, and 1200 designates a control panel.

As is apparent from the afore-mentioned explanation, according to the ink jet head of the present invention, when the ink jet head is in the stored or preserved condition, for example, before it is assembled to the recording apparatus, since the electrode terminals of the energy generating means of the ink jet recording head are electrically connected to be short-circuited or to be discharged, even if the head is stored for a long time in the environment where the surrounding temperature changes, it is possible to prevent the worsening of the recording features regarding the ink discharge, such as a decrease in the discharging speed of the ink droplet or a reduction in the diameter of the ink droplet.

We claim:

1. A method for preserving an ink jet head, the method comprising the steps of:

providing an ink jet head having a plurality of energy generating means for generating energy used to discharge ink, wherein said ink jet head is mountable on a recording apparatus for supply of recording signals to said energy generating means by plural electrical wires extending in a flexible cable, the flexible cable having an end and an other end, the electrical wires extending from the one end thereof, the flexible cable having plural electrical contact portions including discrete electrode terminals and a common electrode terminal disposed at the other end of the flexible cable, the recording apparatus to be connected to the electrical contact portions; and electrically connecting in common said plural electrical contact portions using a resilient conductive means including a pair of plate-shaped members to be clipped onto said flexible cable at the plural electrical contact portions.

2. An ink jet head unit comprising:

an ink jet head having a plurality of energy generating means for generating energy utilized to discharge ink;

a flexible cable, having an end and an other end, the flexible cable being coupled to said ink jet head at the one end thereof and having plural electrical wires extending in said flexible cable and corresponding plural electrical contact portions formed at the other end of said flexible cable for supplying electrical signals to said energy generating means, the plural electrical contact portions including discrete electrode terminals and a common electrode terminal; and resilient conductive means including a pair of plate-shaped members to be clipped on the other end of said flexible cable at the electrical contact portions for electrically connecting them in common during storage of said ink jet head, prior to mounting in a recording apparatus.

3. An ink jet head unit according to claim 2, wherein a direction in which the ink is supplied to said energy generating means is substantially the same as a direction in which the ink is discharged.

4. An ink jet head unit according to claim 2, wherein a first direction in which the ink is supplied to said energy generating means differs from a second direction in which the ink is discharged.

5. An ink jet head unit according to claim 4, wherein said first and second directions are substantially orthogonal to each other.

6. An ink jet unit according to claim 2, wherein said conductive means is made of material selected from among metal and conductive organic material.

7. An ink jet head unit according to claim 6, wherein said conductive organic material is selected from among conductive rubber and conductive resin.

* * * * *

UNITED STATES PATENT AND TRADEMARK OFFICE
CERTIFICATE OF CORRECTION

PATENT NO. : 5,670,998

DATED : September 23, 1997

INVENTOR(S): JUNJI SHIMODA, ET AL.

It is certified that error appears in the above-identified patent and that said Letters Patent is hereby corrected as shown below:

ON TITLE PAGE, AT [56], REFERENCES CITED, FOREIGN PATENT DOCUMENTS
  "59-205740A of 1983" should read --59-205740A 11/1984--; and
  "59-107698A of 1983" should read --59-107698A 6/1984--.

COLUMN 2
  Line 26, "a" should read --an--.

COLUMN 3
  Line 19, "PREFERRED" should read --THE PREFERRED--;
  Line 53, "an" should read --a--.

COLUMN 4
  Line 6, "resistant" should read --resistance--.

COLUMN 5
  Table 1, insert at end of "Table 1": (Values in the table
    show an average of ten samples)--;
  Line 35, "another/conductive" should read --another
    conductive--;
  Line 51, "an" should read --a--.

COLUMN 6
  Line 20, "FIG. 5." should read --FIG. 1.--;
  Line 35, "resist" should read --resistance--;
  Line 47, "the" (first occurrence) should be deleted;
  Line 54, "arise" should read --that arise--;
  Line 64, "afore-mentioned" should read --aforementioned--.

UNITED STATES PATENT AND TRADEMARK OFFICE
CERTIFICATE OF CORRECTION

PATENT NO. : 5,670,998

DATED : September 23, 1997

INVENTOR(S): JUNJI SHIMODA, ET AL.          Page 2 of 2

It is certified that error appears in the above-identified patent and that said Letters Patent is hereby corrected as shown below:

<u>COLUMN 7</u>
Line 18, "an other" should read --another--;
Line 33, "an other" should read --another--.

<u>COLUMN 8</u>
Line 27, "unit" should read --head unit--.

Signed and Sealed this

Seventh Day of July, 1998

Attest:

BRUCE LEHMAN

Attesting Officer    Commissioner of Patents and Trademarks